(12) United States Patent
Takai

(10) Patent No.: US 8,396,277 B2
(45) Date of Patent: Mar. 12, 2013

(54) MAGNETIC RESONANCE IMAGING APPARATUS

(75) Inventor: Hiroshi Takai, Nasushiobara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 209 days.

(21) Appl. No.: 13/040,591

(22) Filed: Mar. 4, 2011

(65) Prior Publication Data

US 2011/0216955 A1  Sep. 8, 2011

(30) Foreign Application Priority Data

Mar. 5, 2010 (JP) ................................ 2010-049524
Feb. 16, 2011 (JP) ................................ 2011-031342

(51) Int. Cl.
*G06K 9/00* (2006.01)
*A61B 5/05* (2006.01)

(52) U.S. Cl. ........................ 382/131; 600/410

(58) Field of Classification Search ................ 382/128, 382/129, 130, 131, 132, 133, 134; 324/307, 324/309, 213, 313, 318, 319; 424/9.3; 436/173; 600/407, 410, 411, 425, 427, 524
See application file for complete search history.

(56) References Cited

U.S. PATENT DOCUMENTS 6,876,201 B2 * 4/2005 Takizawa et al. ............. 324/318
7,218,108 B2 * 5/2007 Ichinose et al. ............... 324/309

FOREIGN PATENT DOCUMENTS

JP  2004-329613  11/2004

OTHER PUBLICATIONS

Pruessmann et al., "Sense: Sensitivity Encoding for Fast MRI", Magnetic Resonance in Medicine 42: pp. 952-962 (1999).
Pipe, "Motion Correction with Propeller MRI: Application to Head Motion and Free-Breathing Cardiac Imaging", Magnetic Resonance in Medicine 42:963, (1999).

* cited by examiner

*Primary Examiner* — Abolfazl Tabatabai
(74) *Attorney, Agent, or Firm* — Nixon & Vanderhye PC

(57) ABSTRACT

In an MRI apparatus, an executing unit executes an image taking sequence according to a parallel imaging method so as to collect MR signals by using a plurality of RF coils; a reconstructing unit reconstructs an MR image from the MR signals; an unfolding processing unit performs an unfolding process to unfold aliasing that has occurred in the MR image, by using sensitivity distribution data indicating a spatial sensitivity distribution of the RF coils; a judging unit judges whether the unfolded image includes one or more pixels of which the pixel values are abnormal; and when the judgment result is in the affirmative, a correcting unit corrects the sensitivity distribution data so that the pixel values of the pixels become closer to a normal value. After the sensitivity distribution data has been corrected, the unfolding processing unit performs the unfolding process again by using the corrected sensitivity distribution data.

9 Claims, 8 Drawing Sheets

MAGNETIC RESONANCE IMAGING APPARATUS

CROSS-REFERENCE TO RELATED APPLICATIONS

This application is based upon and claims the benefit of priority from Japanese Patent Application No. 2010-049524, filed on Mar. 5, 2010; and Japanese Patent Application No. 2011-031342, filed on Feb. 16, 2011, the entire contents of all of which are incorporated herein by reference.

FIELD

Embodiments described herein relate generally to a magnetic resonance imaging apparatus.

BACKGROUND

Magnetic Resonance Imaging (MRI) apparatuses are configured so as to magnetically excite nuclear spins of a subject placed in a static magnetic field by using Radio Frequency (RF) signals at a Larmor frequency and to reconstruct a Magnetic Resonance (MR) image from Magnetic Resonance (MR) signals generated due to the excitation. Examples of imaging methods that use such MRI apparatuses include a method called "parallel imaging method".

According to the parallel imaging method, an array coil that includes a plurality of RF coils called element coils is used. In addition, by skipping some of phase encoding processes, MR signals are collected with a reduced number of phase encoding processes that has been reduced to a value expressed as "a predetermined number of phase encoding processes required to reconstruct the MR image" divided by "the number of RE coils". As a result, the RE coils simultaneously receive the MR signals, so that an MR image is reconstructed from the received MR signal for each of the RF coils. When such a parallel imaging method is used, the Field Of View (FOV) of the MR image that is generated for each of the RF coils is small, and it is therefore possible to shorten the scanning time period and to speed up the image taking process.

When the parallel imaging method is used, aliasing occurs at the edges of the MR images reconstructed from the MR signals that have been collected by the RF coils. For this reason, according to the parallel imaging method, by making use of the fact that the sensitivity levels of the plurality of RF coils are different from one another, an unfolding process to unfold the aliasing that has occurred in each of the plurality of MR images obtained by the RF coils is performed as a post-processing process. To perform the unfolding process, sensitivity distribution data indicating spatial sensitivity distributions of the RF coils is used. Further, a plurality of unfolded images that have been obtained as a result of the unfolding process are combined into a final FOV image. As explained here, according to the parallel imaging method, it is possible to speed up the image taking process, and it is also possible to obtain an image having a large field of view such as an image of the entire abdomen.

According to the conventional parallel imaging method described above, however, there are situations where, as explained below, the unfolded image obtained as a result of the unfolding process includes one or more pixels of which the pixel values are abnormal and where the quality of the unfolded image is degraded by such pixels.

As described above, according to the conventional parallel imaging method, by making use of the difference in the sensitivity distributions between the element coils included in the array coil, the unfolding process is performed, based on the MR images that are generated in correspondence with the receiving channels and in which the aliasing has occurred and based on the sensitivity distribution data of the channels. During the unfolding process, pixel values are calculated with respect to different points in the image obtained as a result of the unfolding process by using, for example, Expression (1) shown below, so that the unfolded image in which the aliasing is unfolded is generated by putting together the calculated pixel values at the different points.

$$x = (S_H S)^{-1} S_H y \tag{1}$$

In Expression (1), "x" denotes the signal intensities at the points in the unfolded image (i.e., vectors of which the quantity is equal to N[pt]), whereas "y" denotes the intensities of the signals measured by the element coils (i.e., vectors of which the quantity is equal to N[ch]: $y = \{V(1), V(2), \ldots V(N[ch])\}$). Further, "S" denotes the coil sensitivity levels at the points being the target of the unfolding process (i.e., an $N[CH] \times N[pt]$ matrix), whereas "$S_H$" denotes a transposed conjugate matrix.

During such an unfolding process, generally speaking, a pseudo inversed matrix is calculated by performing a lower-upper (LU) decomposition process. In a division process performed during the LU decomposition, there are situations where the divisor is extremely small. This phenomenon occurs, for example, when the sensitivity difference between the channels in the spatial positions in the sensitivity distribution data used in the unfolding process is small or when the subject mistakenly moved between a scanning process performed to create the sensitivity distribution data and a scanning process in a main image-taking process.

In the case where the divisor in the LU decomposition is extremely small as mentioned above, the components of the inverse matrix will have extremely large values. As a result, there are situations in which the absolute values of the pixels values of some of the pixels in the unfolded image resulting from the unfolding process are extremely large. FIG. 8 is a drawing for explaining the problems with the conventional technique. As shown in FIG. 8, there are situations in which an unfolded image 31 includes pixels 32 of which the pixel values are extremely large, in such positions that are, for example, near an edge portion of the image. As a result, there are situations where the quality of the unfolded image is degraded by such pixels of which the pixel values are abnormal.

DETAILED DESCRIPTION

An MRI apparatus according to an embodiment includes an executing unit, a reconstructing unit, an unfolding processing unit, a judging unit, and a correcting unit. The executing unit executes an image taking sequence according to a parallel imaging method so as to collect MR signals by using a plurality of RF coils. The reconstructing unit reconstructs an MR image from the MR signals. The unfolding processing unit performs an unfolding process so as to unfold aliasing that has occurred in the MR image, by using sensitivity distribution data indicating a spatial sensitivity distribution of the RF coils. The judging unit judges whether the unfolded image obtained as a result of the unfolding process includes one or more pixels of which the pixel values are abnormal. In the case where the judging unit has judged that the unfolded image includes one or more pixels of which the pixel values are abnormal, the correcting unit corrects the sensitivity distribution data in such a manner that the pixel values of the pixels become closer to a normal value. Further, after the sensitivity distribution data has been corrected, the unfolding processing unit performs the unfolding process again by using the sensitivity distribution data that has been corrected.

In the following sections, exemplary embodiments of an MRI apparatus will be explained in detail with reference to the accompanying drawings.

Figure 1:
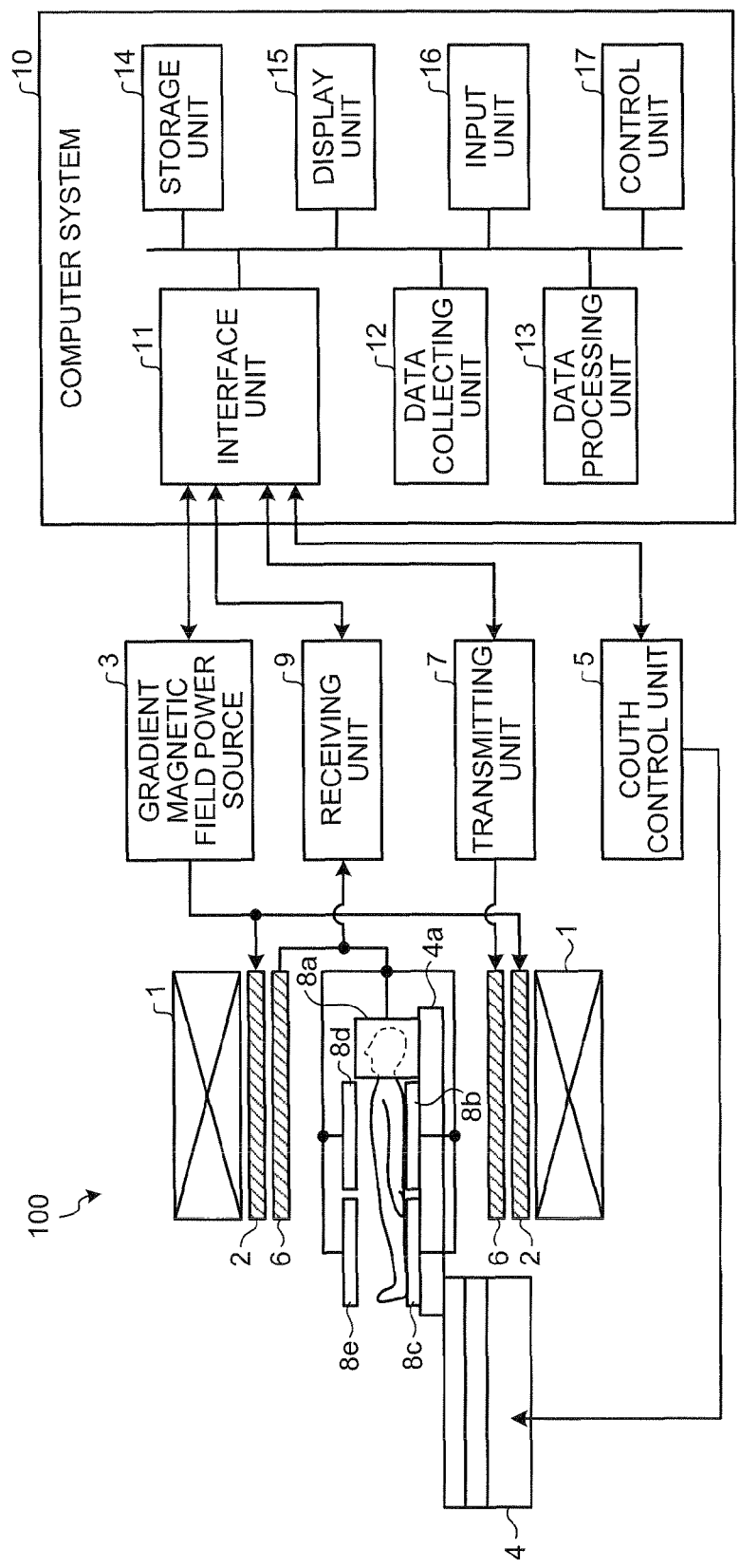
FIG. 1 is a diagram of an MRI apparatus according to a first embodiment.

First, a configuration of an MRI apparatus according to a first embodiment will be explained. FIG. 1 is a diagram of an MRI apparatus 100 according to the first embodiment. As shown in FIG. 1, the MRI apparatus 100 includes a static magnetic field magnet 1, a gradient coil 2, a gradient magnetic field power source 3, a couch 4, a couch control unit 5, a transmitting coil 6, a transmitting unit 7, receiving coils 8a to 8e, a receiving unit 9, and a computer system 10.

The static magnetic field magnet 1 is formed in the shape of a hollow circular cylinder and generates a uniform static magnetic field in the space on the inside thereof. The static magnetic field magnet 1 may be configured by using, for example, a permanent magnet, a superconductive magnet, or the like.

The gradient coil 2 is formed in the shape of a hollow circular cylinder and is disposed on the inside of the static magnetic field magnet 1. The gradient coil 2 is formed by combining three coils corresponding to x-, y-, and z-axes that are orthogonal to one another. These three coils individually receive a supply of electric current from the gradient magnetic field power source 3 (explained later) and generate gradient magnetic fields of which the magnetic field intensities change along the x-, y-, and z-axes. For example, the z-axis direction is set to be the same as the direction of the static magnetic field.

In this situation, the gradient magnetic fields on the x-, y-, and z-axes that are generated by the gradient coil 2 correspond to, for example, a read-out-purpose gradient magnetic field Gr, a phase-encoding-purpose gradient magnetic field Ge, and a slice-selecting-purpose gradient magnetic field Gs, respectively. The read-out-purpose gradient magnetic field Gr is used for changing the frequency of an MR signal according to a spatial position. The phase-encoding-purpose gradient magnetic field Ge is used for changing the phase of an MR signal according to a spatial position. The slice-selecting-purpose gradient magnetic field Gs is used for determining an image-taking cross section in an arbitrary manner.

The gradient magnetic field power source 3, under control of the computer system 10, supplies the electric current to the gradient coil 2.

The couch 4 includes a couchtop 4a on which a subject P is placed. Under control of the couch control unit 5 (explained later), while the subject P is placed thereon, the couchtop 4a is inserted into the hollow (i.e., an image taking opening) of the gradient coil 2. Normally, the couch 4 is provided so that the longitudinal direction thereof extends parallel to the central axis of the static magnetic field magnet 1.

The couch control unit 5 drives the couch 4 so that the couchtop 4a moves in the longitudinal direction or in an up-and-down direction.

The transmitting coil 6 is disposed on the inside of the gradient coil 2 and generates a high-frequency magnetic field by receiving a supply of a high-frequency pulse from the transmitting unit 7. The transmitting coil 6 may be configured by using, for example, a whole body (WB) coil that is substantially formed in the shape of a circular cylinder. The transmitting coil 6 is configured so as to be able to also receive an MR signal that has been emitted from the subject P due to an influence of the high-frequency magnetic field. When having received the MR signal, the transmitting coil 6 transmits the received MR signal to the receiving unit 9.

The transmitting unit 7, under control of the computer system 10, transmits the high-frequency pulse corresponding to a Larmor frequency to the transmitting coil 6.

The receiving coils 8a to 8e are disposed on the inside of the gradient coil 2 and receive the MR signal emitted from the subject P due to the influence of the high-frequency magnetic field. The receiving coil 8a is a coil designed for the head and is attached to the head of the subject P. The receiving coils 8b and 8c are coils designed for the spine and are disposed between the back of the subject P and the couchtop 4a. The receiving coils 8d and 8e are coils designed for the abdomen and are attached onto the abdomen side of the subject P.

Each of the receiving coils 8a to 8e is an array coil including a plurality of element coils (i.e., RF coils) that receive the magnetic resonance (MR) signals emitted from the subject P. Further, when the MR signals have been received by the element coils included therein, each of the receiving coils 8a to 8e outputs the received MR signals to the receiving unit 9.

The receiving unit 9 generates, under control of the computer system 10, MR signal data, based on the MR signals that have been output from the receiving coils 8a to 8e. Further, when having generated the MR signal data, the receiving unit 9 transmits the generated MR signal data to the computer system 10.

The receiving unit 9 includes a plurality of receiving channels for receiving the MR signals that have been output from the plurality of element coils included in the receiving coils 8a to 8e. Further, when having been notified by the computer system 10 of the element coils that are used in the image taking process, the receiving unit 9 assigns the receiving channels to the element coils indicated in the notification so that the MR signals that are output by the element coils indicated in the notification can be received.

The computer system 10 exercises overall control of the MRI apparatus 100. For example, the computer system 10 executes various types of image taking sequences by driving the gradient magnetic field power source 3, the transmitting unit 7, and the receiving unit 9, based on image taking conditions that have been set by an operator. Further, the computer system 10 reconstructs an MR image from the MR signals that have been collected by executing the image taking sequences. The computer system 10 includes an interface unit 11, a data collecting unit 12, a data processing unit 13, a storage unit 14, a display unit 15, an input unit 16, and a control unit 17.

The interface unit 11 is connected to the gradient magnetic field power source 3, the couch control unit 5, the transmitting unit 7, and the receiving unit 9 and controls inputs and outputs of signals that are transmitted and received between these functional units and the computer system 10.

The data collecting unit 12 collects via the interface unit 11 the MR signal data that has been transmitted from the receiving unit 9 and stores the collected MR signal data into the storage unit 14.

The data processing unit 13 performs various types of data processing. For example, the data processing unit 13 reconstructs an MR image indicating the inside of the subject P, by applying a post-processing process such as a Fourier transform to the MR signal data stored in the storage unit 14. Also, by applying a predetermined processing process such as a cross-section conversion to the MR signal data stored in the storage unit 14, the data processing unit 13 creates sensitivity distribution data indicating spatial sensitivity distributions of the element coils included in the receiving coils 8a to 8e. Further, the data processing unit 13 stores the MR image and the sensitivity distribution data that have been generated, into the storage unit 14.

The storage unit 14 stores therein various types of data processed by the computer system 10. In addition, the storage unit 14 stores therein the MR signal data that has been collected by the data collecting unit 12, as well as the MR image and the sensitivity distribution data that have been generated by the data processing unit 13. The storage unit 14 may be configured by using, for example, a Hard Disk Drive (HDD) or a Random Access Memory (RAM).

The display unit 15 displays various types of information such as the MR image that has been generated by the data processing unit 13. The display unit 15 may be configured by using, for example, a display device such as a liquid crystal display device.

The input unit 16 receives various types of operations and inputs of information from the operator. For example, the input unit 16 may be configured by using any of the following: a pointing device such as a mouse and/or a trackball; a selecting device such as a mode changing switch; and an input device such as a keyboard.

The control unit 17 includes a Central Processing Unit (CPU), a memory, and the like (not shown) and exercises control over the MRI apparatus 100 in an integrated manner by executing various types of computer programs. For example, the control unit 17 executes the various types of image taking sequences by driving the gradient magnetic field power source 3, the transmitting unit 7, and the receiving unit 9, based on the image taking conditions that have been received from the operator via the input unit 16. Further, after having executed an image taking sequence, the control unit 17 controls the data processing unit 13 so that the data processing unit 13 generates the MR image or the sensitivity distribution data from the collected MR signals.

The configuration of the MRI apparatus 100 according to the first embodiment has been explained above. With this configuration, according to the first embodiment, the computer system 10 executes an image taking sequence according to the parallel imaging method so as to collect the MR signals by using the plurality of element coils included in the receiving coils 8a to 8e and reconstructs the MR image from the MR signals that have been collected. Further, by using the sensitivity distribution data indicating the spatial sensitivity distributions of the element coils, the computer system 10 performs an unfolding process to unfold aliasing that has occurred in the MR image. After that, the computer system 10 judges whether an unfolded image obtained as a result of the unfolding process includes one or more pixels of which the pixel values are abnormal. In the case where the computer system 10 has judged that the unfolded image includes one or more pixels of which the pixel values are abnormal, the computer system 10 corrects the sensitivity distribution data in such a manner that the sensitivity difference between the channels in the position of each of the pixels becomes larger and performs the unfolding process again by using the sensitivity distribution data that has been corrected.

In other words, according to the first embodiment, in the case where the unfolded image obtained as a result of the unfolding process includes one or more pixels of which the pixel values are abnormal, the sensitivity distribution data is corrected in such a manner that the pixel values of the pixels become closer to a normal value, so that the unfolding process is performed again by using the sensitivity distribution data that has been corrected. As a result, according to the first embodiment, it is possible to eliminate the one or more pixels of which the pixel values are abnormal from the unfolded image obtained as a result of the unfolding process, and it is therefore possible to improve the quality of the image that has been obtained by using the parallel imaging method.

Figure 2:
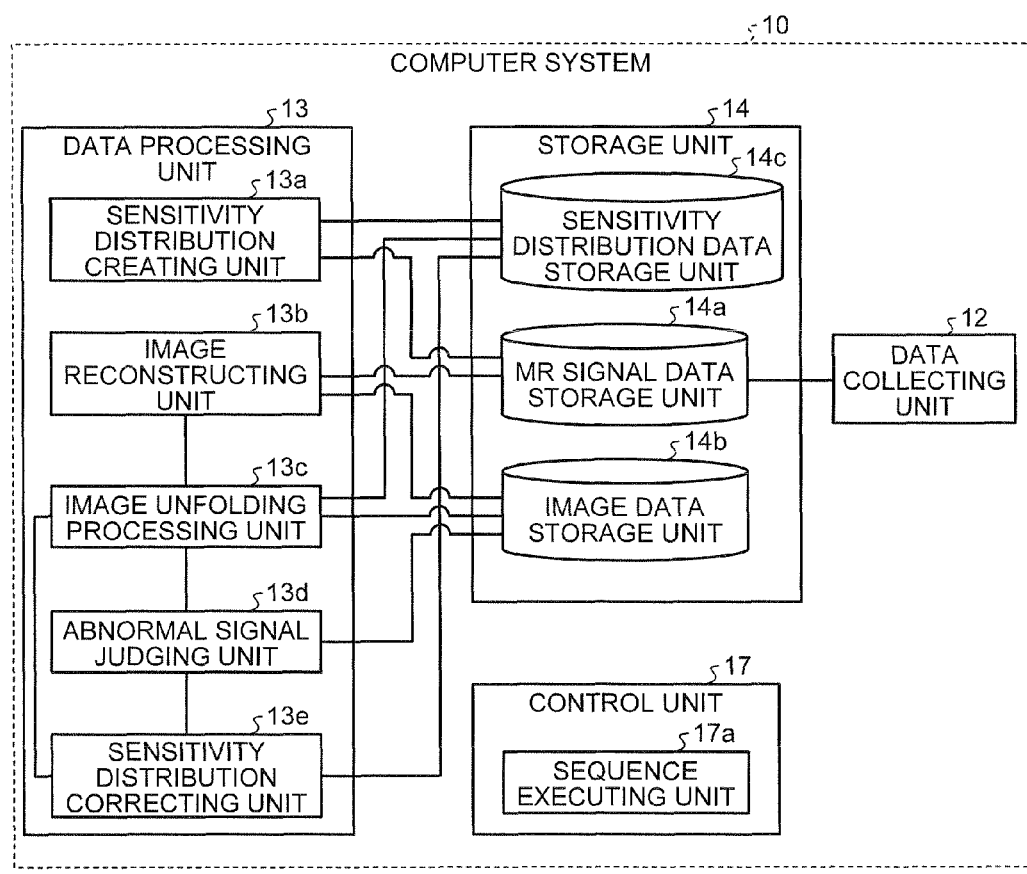
FIG. 2 is a detailed functional block diagram of a computer system according to the first embodiment.

In the following sections, the MRI apparatus 100 according to the first embodiment will be explained more specifically. FIG. 2 is a detailed functional block diagram of the computer system 10 according to the first embodiment. Of the functional units included in the computer system 10 shown in FIG. 1, the data processing unit 13, the storage unit 14, and the data collecting unit 12 are shown in FIG. 2.

As shown in FIG. 2, the computer system 10 includes the data processing unit 13, the storage unit 14, and the data collecting unit 12.

The storage unit 14 includes an MR signal data storage unit 14a, an image data storage unit 14b, and a sensitivity distribution data storage unit 14c. The MR signal data storage unit 14a stores therein the MR signal data that has been collected by the data collecting unit 12. The image data storage unit 14b stores therein the MR image that has been generated by the data processing unit 13. The sensitivity distribution data storage unit 14c stores therein, in correspondence with each of the element coils that are included in the receiving coils 8a to Be, the sensitivity distribution data indicating the spatial sensitivity distribution of the element coil.

The control unit 17 includes a sequence executing unit 17a. The sequence executing unit 17a executes the various types of image taking sequences by driving the gradient magnetic field power source 3, the transmitting unit 7, and the receiving unit 9, based on the image taking conditions that have been received from the operator via the input unit 16. For example, the sequence executing unit 17a executes the image taking sequence according to the parallel imaging method or a sensitivity measuring sequence so as to measure the spatial sensitivity distributions of the element coils that are included in the receiving coils 8a to 8e.

The data processing unit 13 includes a sensitivity distribution creating unit 13a, an image reconstructing unit 13b, an image unfolding processing unit 13c, an abnormal signal judging unit 13d, and a sensitivity distribution correcting unit 13e.

The sensitivity distribution creating unit 13a reads the MR signal data that has been collected as a result of executing the sensitivity measuring sequence, out of the MR signal data storage unit 14a, and creates the sensitivity distribution data indicating the spatial sensitivity distributions of the element coils included in the receiving coils 8a to 8e by applying the predetermined processing process such as a cross-section conversion to the MR signal data that has been read. Further, the sensitivity distribution creating unit 13a stores the sensitivity distribution data that has been created, into the sensitivity distribution data storage unit 14c.

The image reconstructing unit 13b reads the MR signal data that has been collected as a result of executing the various types of the image taking sequences, out of the MR signal data storage unit 14a, and reconstructs the MR image indicating the inside of the subject P by applying a post-processing process such as a Fourier transform to the MR signal data that has been read. Further, the image reconstructing unit 13b stores the MR image that has been reconstructed, into the image data storage unit 14b.

The image unfolding processing unit 13c performs the unfolding process so as to unfold the aliasing that has occurred in the MR image by using the sensitivity distribution data indicating the spatial sensitivity distributions of the element coils included in the receiving coils 8a to 8e. Further, in response to an instruction from the sensitivity distribution correcting unit 13e (explained later), the image unfolding processing unit 13c performs the unfolding process again by using the sensitivity distribution data that has been corrected.

The abnormal signal judging unit 13d judges whether the unfolded image obtained as a result of the unfolding process performed by the image unfolding processing unit 13c includes one or more pixels of which the pixel values are abnormal. For example, the abnormal signal judging unit 13d calculates a representative value of the pixel values, based on a distribution state of the pixel values of the pixels included in the unfolded image and judges whether the unfolded image includes one or more pixels of which the pixel values are abnormal, based on the representative value that has been calculated.

As a more specific example, the abnormal signal judging unit 13d generates a histogram of the pixel values of the pixels included in the unfolded image and calculates a median as the representative value of the pixel values from the generated histogram. Further, for example, the abnormal signal judging unit 13d sets a value obtained by multiplying the calculated median by a predetermined ratio to be a threshold value and judges that any pixel value that is equal to or larger than the threshold value is abnormal. In addition, the abnormal signal judging unit 13d also judges that any pixel of which the pixel value is indicated as NaN (Not a Number) in a calculation process included in the unfolded process is abnormal. By using these judging methods, the abnormal signal judging unit 13d judges whether the unfolded image includes one or more pixels of which the pixel values are abnormal.

Further, in the case where the abnormal signal judging unit 13d has judged that the unfolded image includes no pixel of which the pixel value is abnormal, the abnormal signal judging unit 13d registers the unfolded image that has been generated by the image unfolding processing unit 13c, into the image data storage unit 14b. On the contrary, in the case where the abnormal signal judging unit 13d has judged that the unfolded image includes one or more pixels of which the pixel values are abnormal, the abnormal signal judging unit 13d notifies the sensitivity distribution correcting unit 13e (explained later) that the unfolded image includes one or more pixels of which the pixel values are abnormal.

In the case where the abnormal signal judging unit 13d has judged that the unfolded image includes one or more pixels of which the pixel values are abnormal, the sensitivity distribution correcting unit 13e corrects the sensitivity distribution data in such a manner that the pixel values of the pixels become closer to a normal value. According to the first embodiment, the sensitivity distribution correcting unit 13e corrects the sensitivity distribution data in such a manner that the sensitivity difference between the channels in the position of each of the pixels of which the pixel values have been judged to be abnormal becomes larger.

As a more specific example, when the sensitivity distribution correcting unit 13e has been notified by the abnormal signal judging unit 13d that the unfolded image includes one or more pixels of which the pixel values are abnormal, the sensitivity distribution correcting unit 13e corrects the sensitivity distribution data of the element coils that is stored in the sensitivity distribution data storage unit 14c. In this situation, the sensitivity distribution correcting unit 13e corrects the sensitivity distribution data in such a manner that the sensitivity difference between the channels in the position of each of the pixels of which the pixel values have been judged to be abnormal becomes larger by, for example, exponentiating the value of the sensitivity distribution in the position (e.g., by using an exponent of 1.005). As another example, the sensitivity distribution correcting unit 13e calculates an average value by using the sensitivity distributions at sixteen points that are positioned near each of the pixels of which the pixel values have been judged to be abnormal and corrects the sensitivity distribution data in such a manner that the calculated average value is set to be the sensitivity distribution in the position of each of the pixels of which the pixel values have been judged to be abnormal.

After that, when the sensitivity distribution data of the element coils has been corrected, the sensitivity distribution correcting unit 13e instructs the image unfolding processing unit 13c to perform the unfolding process again by using the sensitivity distribution data that has been corrected.

Figure 3:
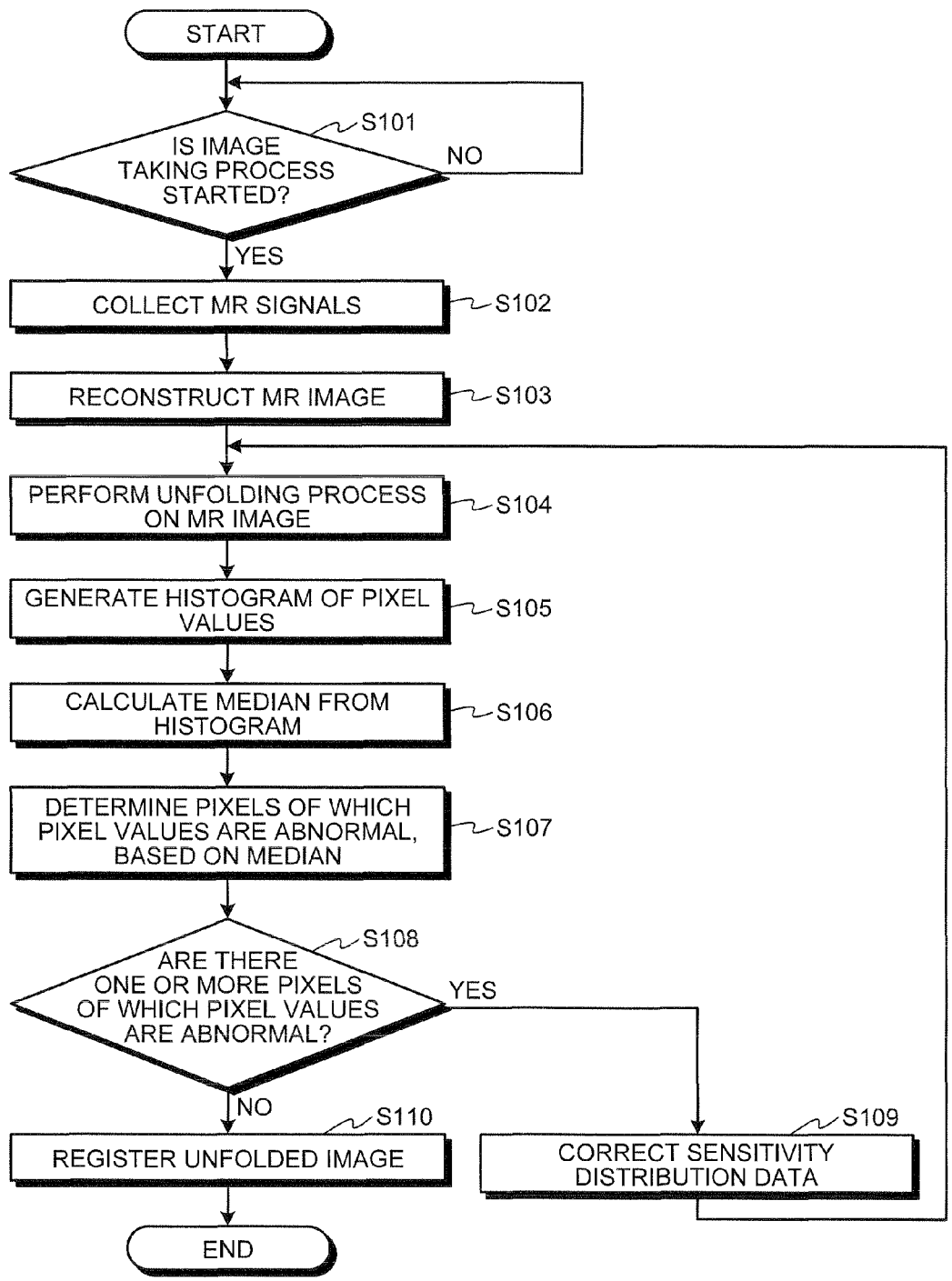
FIG. 3 is a flowchart of a processing procedure using a parallel imaging method that is performed by the MRI apparatus according to the first embodiment.

Next, a processing procedure using the parallel imaging method that is performed by the MRI apparatus 100 according to the first embodiment will be explained. FIG. 3 is a flowchart of the processing procedure using the parallel imaging method that is performed by the MRI apparatus 100 according to the first embodiment. In the present example, it is assumed that the sensitivity distribution data that has been obtained as a result of executing the sensitivity measuring sequence has already been stored in the sensitivity distribution data storage unit 14c.

As shown in FIG. 3, the MRI apparatus 100 is configured so that, when the sequence executing unit 17a has received an instruction from the operator via the input unit 16 indicating that an image taking process should be started (step S101: Yes), the sequence executing unit 17a executes an image taking sequence according to the parallel imaging method so as to collect MR signals by using a receiving coil that has been selected for the use in the image taking process, out of the receiving coils 8a to 8e (step S102).

After that, the image reconstructing unit 13b reconstructs an MR image from the MR signals that have been collected by the data collecting unit 12 (step S103). Further, the image unfolding processing unit 13c performs an unfolding process on the MR image that has been reconstructed by the image reconstructing unit 13b, by using the sensitivity distribution data stored in the sensitivity distribution data storage unit 14c (step S104).

Subsequently, the abnormal signal judging unit 13d generates a histogram of the pixel values included in the unfolded image that has been obtained as a result of the unfolding process performed by the image unfolding processing unit 13c (step S105). Further, the abnormal signal judging unit 13d calculates a median of the pixel values from the generated histogram (step S106). After that, based on the calculated median, the abnormal signal judging unit 13*d* judges whether the unfolded image includes one or more pixels of which the pixel values are abnormal (step S107).

In this situation, in the case where the abnormal signal judging unit 13*d* has judged that the unfolded image includes one or more pixels of which the pixel values are abnormal (step S108: Yes), the sensitivity distribution correcting unit 13*e* corrects the sensitivity distribution data stored in the sensitivity distribution data storage unit 14*c* in such a manner that the sensitivity difference between the channels in the position of each of the pixels of which the pixel values have been judged to be abnormal becomes larger (step S109).

After that, the process returns to step S104 so that the image unfolding processing unit 13*c* performs the unfolding process again by using the sensitivity distribution data that has been corrected. With this arrangement, until it is judged that the unfolded image includes no pixel of which the pixel value is abnormal, the sensitivity distribution data correcting process and the unfolding process are repeatedly performed. Subsequently, in the case where it has been judged that the unfolded image includes no pixel of which the pixel value is abnormal (step S108: No), the abnormal signal judging unit 13*d* registers the unfolded image that has been generated by the image unfolding processing unit 13*c*, into the image data storage unit 14*b* (step S110).

As described above, according to the first embodiment, the sequence executing unit 17*a* executes the image taking sequence according to the parallel imaging method so as to collect the MR signals by using the plurality of element coils. Further, the image reconstructing unit 13*b* reconstructs the MR image from the MR signals that have been collected by using the parallel imaging method. Also, the image unfolding processing unit 13*c* performs the unfolding process so as to unfold the aliasing that has occurred in the MR image, by using the sensitivity distribution data indicating the spatial sensitivity distributions of the element coils. Further, the abnormal signal judging unit 13*d* judges whether the unfolded image obtained as a result of the unfolding process includes one or more pixels of which the pixel values are abnormal. In the case where the abnormal signal judging unit 13*d* has judged that the unfolded image includes one or more pixels of which the pixel values are abnormal, the sensitivity distribution correcting unit 13*e* corrects the sensitivity distribution data in such a manner that the sensitivity difference between the channels in the position of each of the pixels becomes larger. After that, the image unfolding processing unit 13*c* performs the unfolding process again by using the sensitivity distribution data that has been corrected. With these arrangements, according to the first embodiment, it is possible to eliminate the pixels of which the pixel values are abnormal from the unfolded image obtained as a result of the unfolding process, and it is therefore possible to improve the quality of the image that is obtained by using the parallel imaging method.

Further, according to the first embodiment, the abnormal signal judging unit 13*d* calculates the representative value of the pixel values, based on the distribution state of the pixel values of the pixels included in the unfolded image and judges whether the unfolded image includes one or more pixels of which the pixel values are abnormal, based on the representative value that has been calculated. In other words, according to the first embodiment, the reference value used for determining the abnormal pixels changes in accordance with the distribution state of the pixel values in the unfolded image. As a result, according to the first embodiment, it is possible to appropriately eliminate the pixels of which the pixel values are abnormal from the unfolded image, in accordance with the distribution state of the pixel values in the unfolded image.

Further, according to the first embodiment, the abnormal signal judging unit 13*d* calculates the median as the representative value. In other words, according to the first embodiment, even if the pixel values of a part of the pixels included in the unfolded image are locally large, it is possible to perform the judging process on the pixel values without being influenced by such a part of the pixels having the locally-large pixel values. As a result, according to the first embodiment, it is possible to eliminate the pixels of which the pixel values are abnormal from the unfolded image, with a high level of precision.

According to the first embodiment described above, in the case where the unfolded image includes one or more pixels of which the pixel values are abnormal, the pixel values of the pixels are corrected so as to become closer to a normal value, by correcting the sensitivity distribution data in such a manner that the sensitivity difference between the channels becomes larger. However, an embodiment is not limited to this example. For example, another arrangement is acceptable in which the sensitivity distribution data is re-created. In the following sections, an example in which the sensitivity distribution data is re-created will be explained as a second embodiment.

The configuration of the MRI apparatus according to the second embodiment is fundamentally the same as the one shown in FIG. 1, except that the function of the computer system is different. For this reason, in the explanation provided in the following sections, a focus is placed on the function of the computer system according to the second embodiment.

Figure 4:
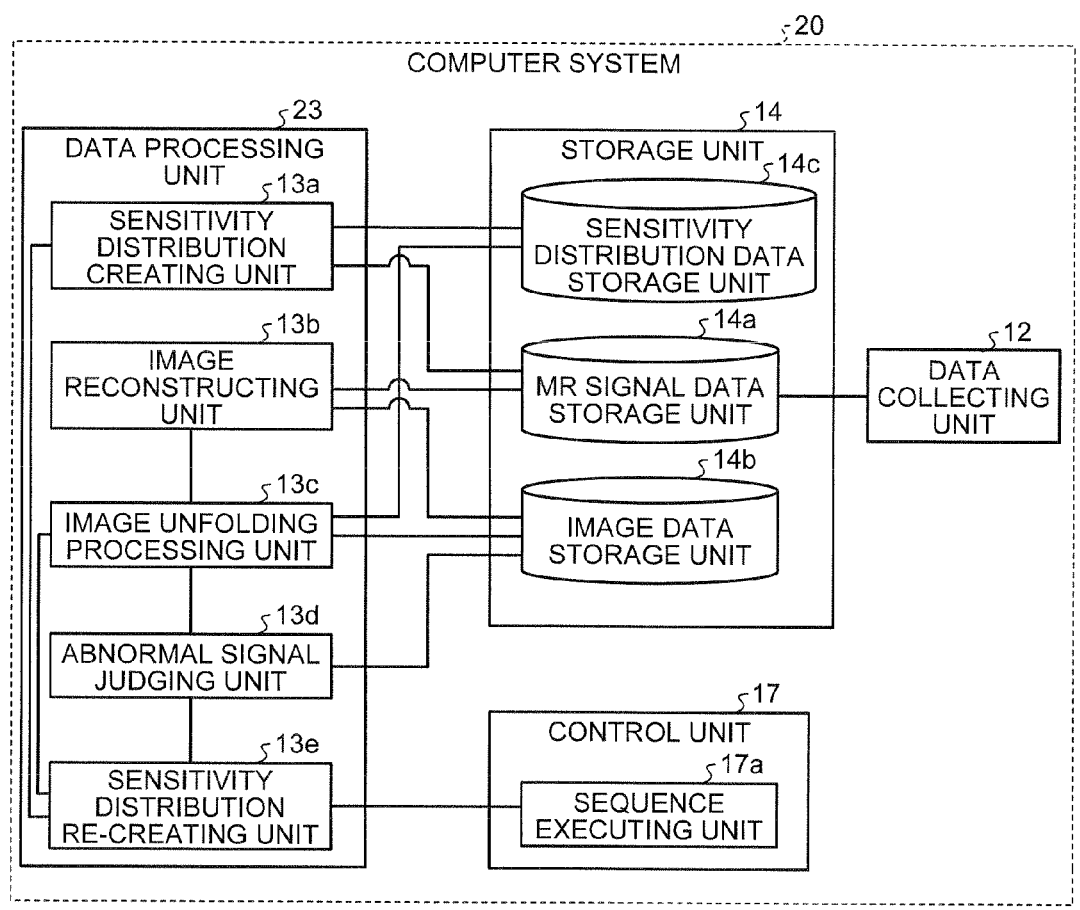
FIG. 4 is a detailed functional block diagram of a computer system according to a second embodiment.

First, a detailed configuration of the computer system according to the second embodiment will be explained. FIG. 4 is a detailed functional block diagram of a computer system 20 according to the second embodiment. In the following sections, for the sake of convenience in the explanation, some of the functional units that have the same roles as those shown in FIG. 2 will be referred to by using the same reference characters, and the detailed explanation thereof will be omitted.

As shown in FIG. 4, the computer system 20 includes a data processing unit 23, the storage unit 14, and the control unit 17. The storage unit 14 includes the MR signal data storage unit 14*a*, the image data storage unit 14*b*, and the sensitivity distribution data storage unit 14*c*. The control unit 17 includes the sequence executing unit 17*a*. The data processing unit 23 includes the sensitivity distribution creating unit 13*a*, the image reconstructing unit 13*b*, the image unfolding processing unit 13*c*, the abnormal signal judging unit 13*d*, and a sensitivity distribution re-creating unit 23*e*. The second embodiment is different from the first embodiment with regard to the function of the sensitivity distribution re-creating unit 23*e* included in the data processing unit 23.

The sensitivity distribution re-creating unit 23*e* re-creates the sensitivity distribution data in such a manner that the pixel values of the pixels become closer to a normal value, in the case where the abnormal signal judging unit 13*d* has judged that the unfolded image includes one or more pixels of which the pixel values are abnormal. According to the second embodiment, the sensitivity distribution re-creating unit 23*e* re-creates the sensitivity distribution data by causing the sequence executing unit 17*a* to execute the sensitivity measuring sequence so as to measure the spatial sensitivity distributions of the element coils included in the receiving coils 8*a* to 8*e*.

As a more specific example, when the sensitivity distribution re-creating unit 23e has been notified by the abnormal signal judging unit 13d that the unfolded image includes one or more pixels of which the pixel values are abnormal, the sensitivity distribution re-creating unit 23e instructs the sequence executing unit 17a to execute the sensitivity measuring sequence again. After MR signal data has been collected as a result of executing the sensitivity measuring sequence, the sensitivity distribution re-creating unit 23e instructs the sensitivity distribution creating unit 13a to re-create sensitivity distribution data by using the MR signal data that has been re-collected. Further, after the sensitivity distribution creating unit 13a has re-created the sensitivity distribution data, the sensitivity distribution re-creating unit 23e instructs the image unfolding processing unit 13c to execute the unfolding process again by using the sensitivity distribution data that has been re-created.

Generally speaking, to perform a sensitivity measuring sequence, a data collecting process that uses a WB coil is performed, in addition to the data collecting process that uses an array coil. The data that has been collected by using the WE coil is used for correcting the luminance level of the unfolded image that has been obtained as a result of the unfolding process. According to the second embodiment, however, when re-executing the sensitivity measuring sequence, the sequence executing unit 17a needs to execute the sensitivity measuring sequence by performing only the data collecting process with the receiving coil selected for the use in the image taking process. As a result, it is possible to shorten the time period required by re-executing the sensitivity measuring sequence, and it is therefore possible to perform the image taking process at a higher speed.

Further, according to the second embodiment, another arrangement is acceptable in which, to re-create the sensitivity distribution data, the sensitivity distribution creating unit 13a adds the re-collected MR signal data to the MR signal data that had already been collected before the re-collecting process, so as to re-create the sensitivity distribution data by using the MR signal data resulting from the addition. With this arrangement, it is possible to improve a Signal-to-Noise Ratio (SNR) of the sensitivity distribution data.

Figure 5:
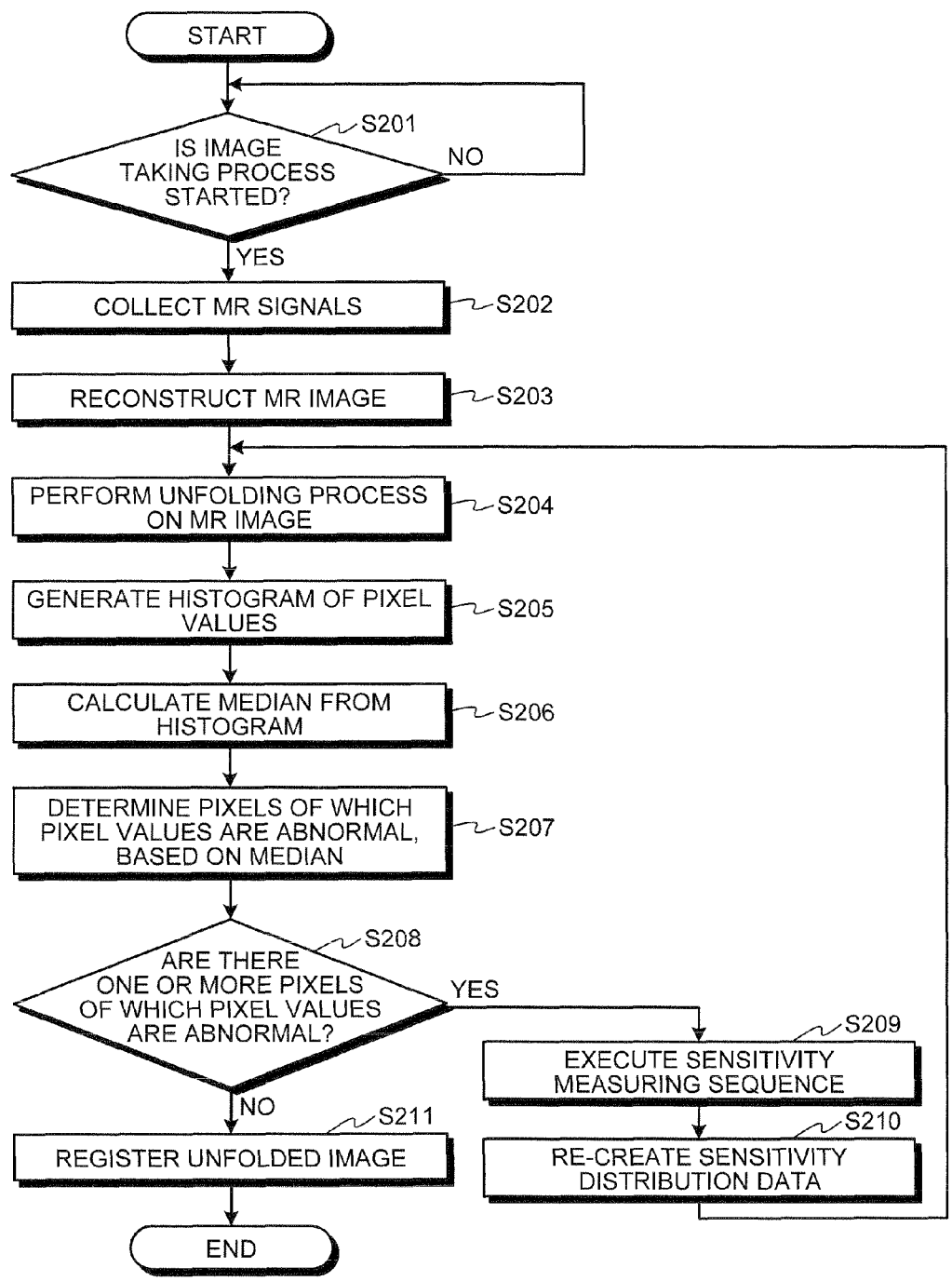
FIG. 5 is a flowchart of a processing procedure using the parallel imaging method that is performed by an MRI apparatus according to the second embodiment.

Next, a processing procedure using the parallel imaging method that is performed by the MRI apparatus according to the second embodiment will be explained. FIG. 5 is a flowchart of the processing procedure using the parallel imaging method that is performed by the MRI apparatus according to the second embodiment. In the present example, it is assumed, like in the first embodiment, that the sensitivity distribution data that has been obtained as a result of executing the sensitivity measuring sequence has already been stored in the sensitivity distribution data storage unit 14c.

First, because the process performed at steps S201 through S207 shown in FIG. 5 is the same as the process performed at steps S101 through S107 shown in FIG. 3, the explanation thereof will be omitted.

After that, according to the second embodiment, in the case where the abnormal signal judging unit 13d has judged that the unfolded image includes one or more pixels of which the pixel values are abnormal (step S208: Yes), the sequence executing unit 17a executes the sensitivity measuring sequence again in response to an instruction from the sensitivity distribution re-creating unit 23e (step S209). Subsequently, in response to an instruction from the sensitivity distribution re-creating unit 23e, the image unfolding processing unit 13c performs the unfolding process again by using the sensitivity distribution data that has been re-created (step S210).

After that, the process returns to step S204 so that the image unfolding processing unit 13c performs the unfolding process again by using the sensitivity distribution data that has been re-created. With this arrangement, until it is judged that the unfolded image includes no pixel of which the pixel value is abnormal, the sensitivity distribution data correcting process and the unfolding process are repeatedly performed. Subsequently, in the case where it has been judged that the unfolded image includes no pixel of which the pixel value is abnormal (step S208: No), the abnormal signal judging unit 13d registers the unfolded image that has been generated by the image unfolding processing unit 13c, into the image data storage unit 14b (step S211).

As described above, according to the second embodiment, the sensitivity distribution re-creating unit 23e re-creates the sensitivity distribution data by causing the executing unit to execute the sensitivity measuring sequence so as to measure the spatial sensitivity distributions of the element coils. For example, when the parallel imaging method is used, in the case where the subject mistakenly moved between a scanning process performed to create the sensitivity distribution data and a scanning process in a main image-taking process, there are situations where the MR image obtained as a result of the unfolding process includes one or more pixels of which the pixel values are abnormal. According to the second embodiment, however, even in those situations, it is possible to replace the sensitivity distribution data so that the pixel values of the pixels included in the unfolded image become closer to a normal value, by re-creating the sensitivity distribution data. As a result, according to the second embodiment, even if the subject mistakenly moved between the scanning process performed to create the sensitivity distribution data and the scanning process in the main image-taking process, it is possible to eliminate the pixels of which the pixel values are abnormal from the unfolded image, and it is therefore possible to improve the quality of the image that is obtained by using the parallel imaging method.

Further, for example, in the case where the image obtained as a result of the unfolding process includes one or more extremely large pixel values, there is a possibility that it may become difficult to make an adjustment of a window level or it may become impossible to appropriately correct the linearity of the gradient magnetic field. According to the first or the second embodiment, however, it is possible to eliminate the pixels of which the pixel values are abnormal from the MR image obtained as a result of the unfolding process, and it is therefore possible to avoid these situations.

The method explained in the first embodiment where the sensitivity distribution data is corrected and the method explained in the second embodiment where the sensitivity distribution data is re-created may be used in combination. In that situation, for example, when the abnormal signal judging unit 13d judges whether the unfolded image includes one or more pixels of which the pixel values are abnormal, the abnormal signal judging unit 13d counts the number of pixels of which the pixel values are abnormal. After that, in the case where the count of the pixels is equal to or smaller than a predetermined threshold value, the abnormal signal judging unit 13d implements the method by which the sensitivity distribution data is corrected. On the contrary, in the case where the count of the pixels of which the pixel values are abnormal exceeds the predetermined threshold value, the abnormal signal judging unit 13d implements the method described in the second embodiment by which the sensitivity distribution data is re-created. With this arrangement, the sensitivity distribution data is corrected in the case where the number of pixels of which the pixel values are abnormal is small, whereas the sensitivity distribution data is re-created in the case where the number of pixels of which the pixel values are abnormal is large. Consequently, it is possible to efficiently eliminate the pixels of which the pixel values are abnormal from the unfolded image.

In the description of the first embodiment, the example was explained in which the MRI apparatus 100 automatically judges whether the unfolded image includes one or more pixels of which the pixel values are abnormal and corrects the sensitivity distribution data based on the judgment result. However, depending on the image taking site and the type of diagnosis to be made, there are situations where no problem is caused even if an unfolded image includes one or more pixels of which the pixel values are abnormal. To cope with these situations, another arrangement is acceptable in which, for example, the operator is allowed to select whether the abnormality judging process should be performed on the unfolded image and whether the sensitivity distribution data should be corrected. In the following sections, examples in those situations will be explained as a third embodiment.

In the third embodiment, examples in which a post-processing process is applied to the unfolded image generated as a result of the unfolding process will be explained. In this situation, examples of the post-processing processes include a volume rendering process, a Multi Planar Reconstruction (MPR) process, and a window level adjusting process. Some of these post-processing processes are not significantly affected even if the unfolded image includes one or more pixels of which the pixel values are abnormal. For this reason, an MRI apparatus according to the third embodiment is configured so that a post-processing process is applied to the unfolded image before abnormality of the unfolded image is judged and so that, after an image resulting from the post-processing process is presented to the operator, an instruction is received from the operator with regard to whether the abnormality judging process should be performed.

The configuration of the MRI apparatus according to the third embodiment is fundamentally the same as the one shown in FIG. 1, except that the function of the computer system is different. For this reason, in the explanation provided in the following sections, a focus is placed on the function of the computer system according to the third embodiment.

Figure 6:
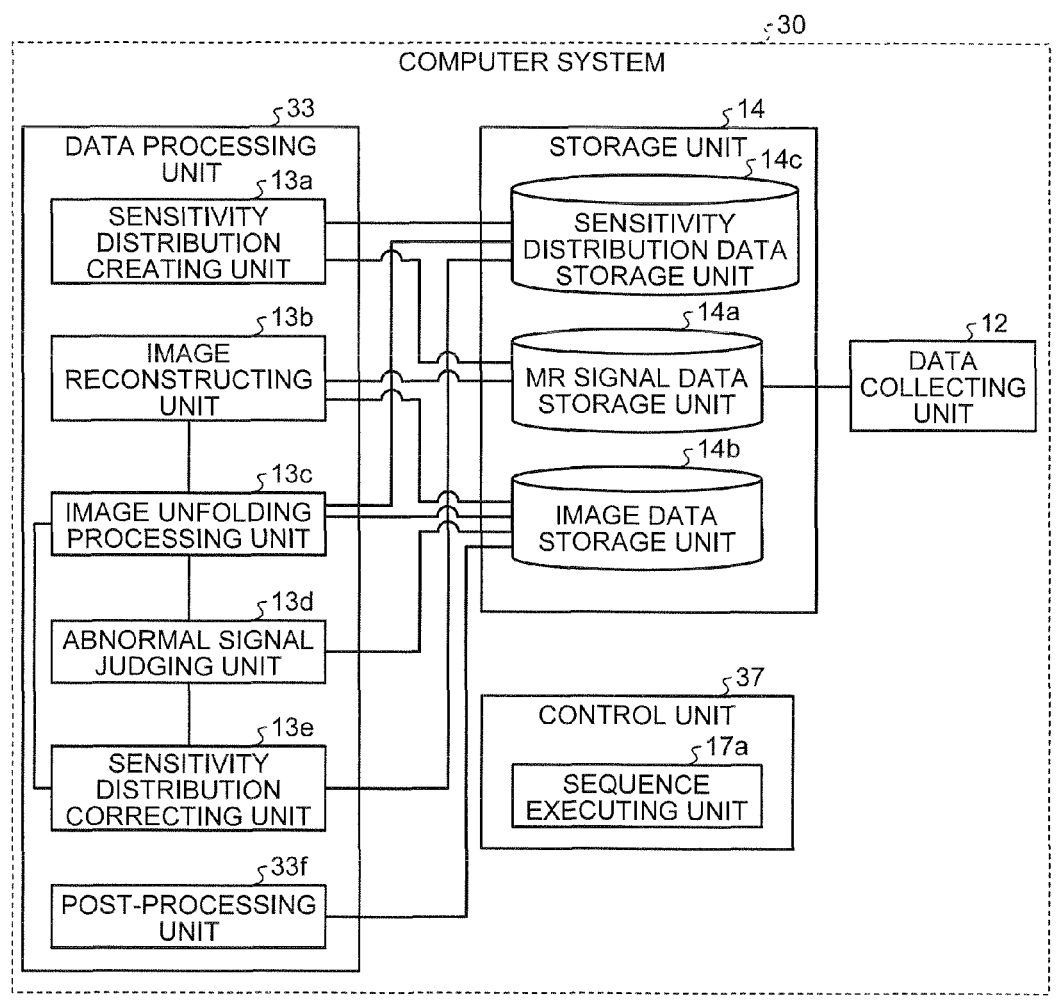
FIG. 6 is a detailed functional block diagram of a computer system according to a third embodiment.

First, a detailed configuration of the computer system according to the third embodiment will be explained. FIG. 6 is a detailed functional block diagram of a computer system 30 according to the third embodiment. In the following sections, for the sake of convenience in the explanation, some of the functional units that have the same roles as those shown in FIG. 2 will be referred to by using the same reference characters, and the detailed explanation thereof will be omitted.

As shown in FIG. 6, the computer system 30 includes a data processing unit 33, the storage unit 14, and a control unit 37. The storage unit 14 includes the MR signal data storage unit 14a, the image data storage unit 14b, and the sensitivity distribution data storage unit 14c. The control unit 37 includes the sequence executing unit 17a. The data processing unit 33 includes the sensitivity distribution creating unit 13a, the image reconstructing unit 13b, the image unfolding processing unit 13c, the abnormal signal judging unit 13d, the sensitivity distribution correcting unit 13e, and a post-processing unit 33f.

The post-processing unit 33f applies a post-processing process to the unfolded image that has been obtained as a result of the unfolding process performed by the image unfolding processing unit 13c. In this situation, the type of the post-processing process performed by the post-processing unit 33f is, for example, determined in advance depending on the image taking site and the type of diagnosis to be made.

The control unit 37 receives various types of instructions from the operator via the input unit 16. According to the third embodiment, from the operator, the control unit 37 receives an instruction regarding whether the abnormality judging process should be performed and an instruction regarding whether the sensitivity distribution data should be corrected. Further, in accordance with the instructions that have been received from the operator, the control unit 37 controls the post-processing unit 33f, the abnormal signal judging unit 13d, and the sensitivity distribution correcting unit 13e.

Figure 7:
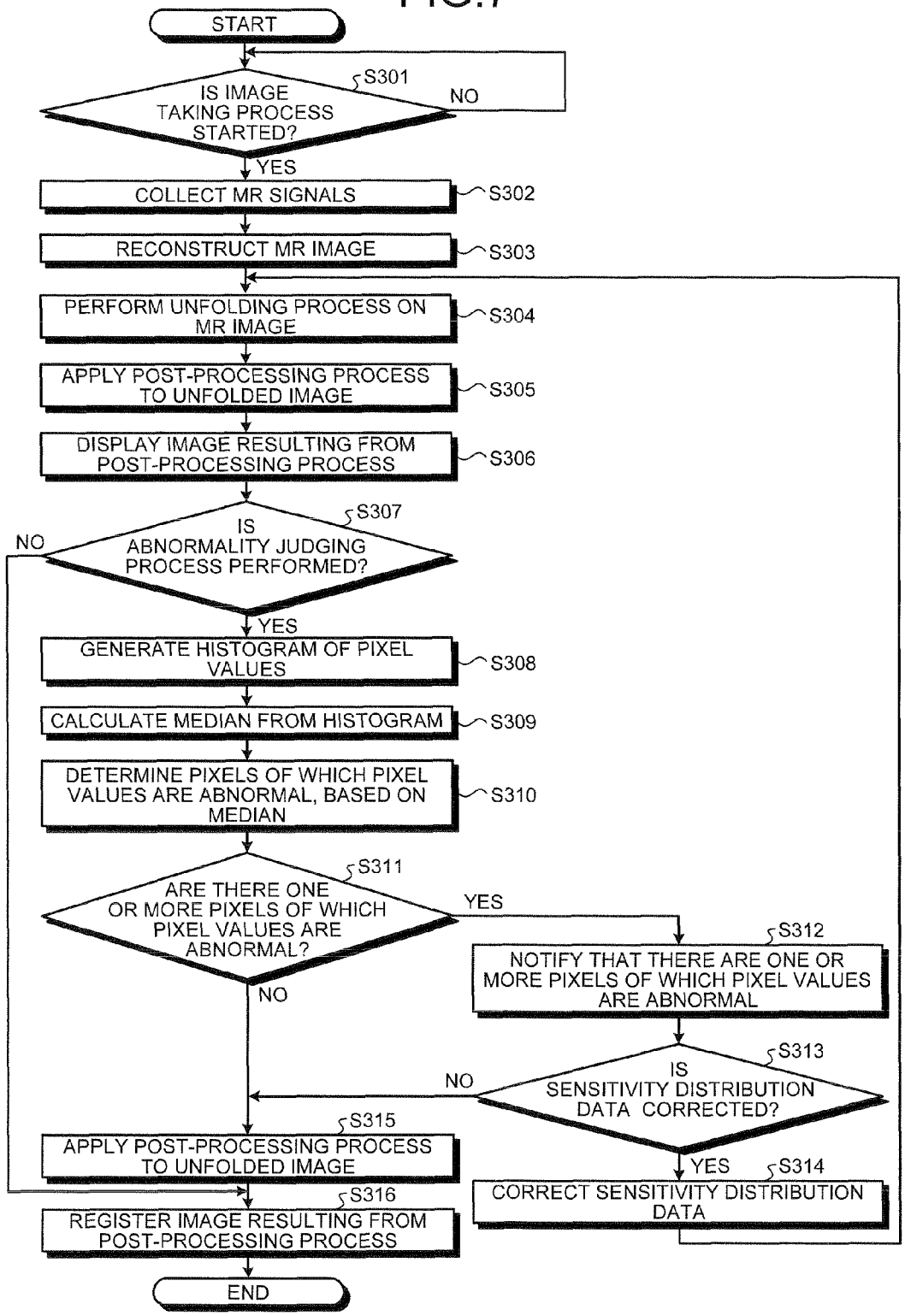
FIG. 7 is a flowchart of a processing procedure using the parallel imaging method that is performed by an MRI apparatus according to the third embodiment.
Figure 8:
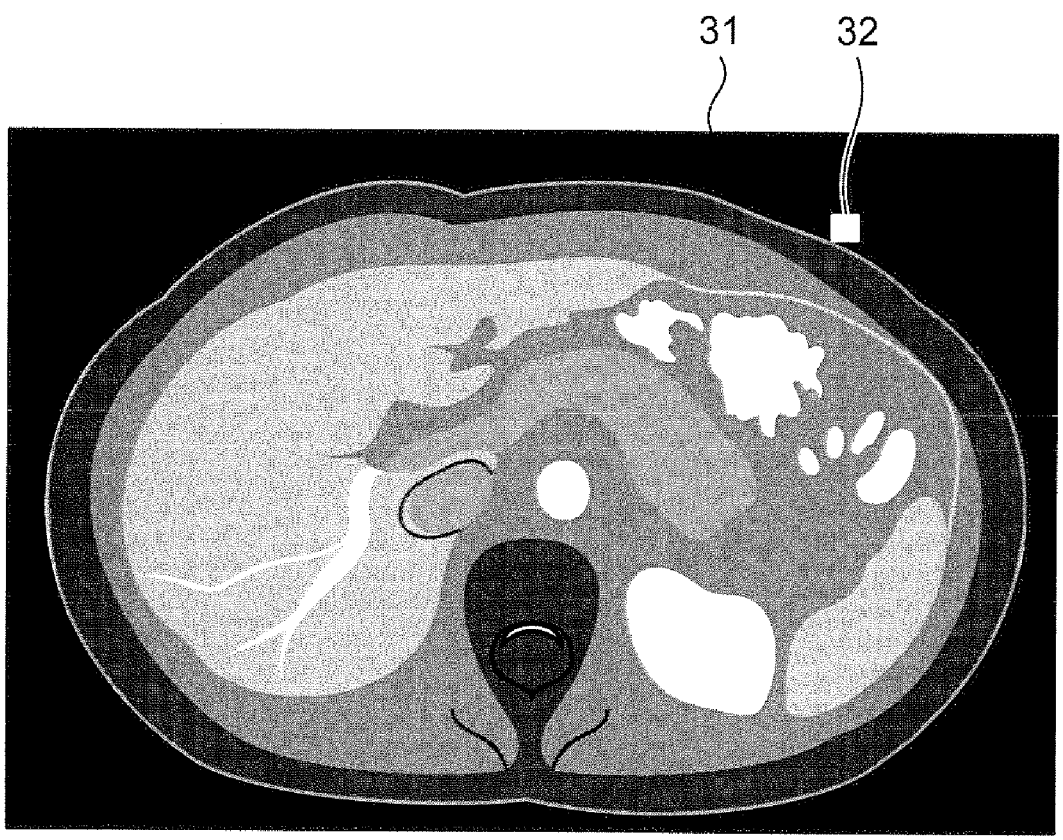
FIG. 8 is a drawing for explaining problems with a conventional technique.

Next, a processing procedure using the parallel imaging method that is performed by the MRI apparatus according to the third embodiment will be explained. FIG. 7 is a flowchart of the processing procedure using the parallel imaging method that is performed by the MRI apparatus according to the third embodiment. In the present example, it is assumed, like in the first embodiment, that the sensitivity distribution data that has been obtained as a result of executing the sensitivity measuring sequence has already been stored in the sensitivity distribution data storage unit 14c.

First, because the process performed at steps S301 through S304 shown in FIG. 7 is the same as the process performed at steps S101 through S104 shown in FIG. 3, the explanation thereof will be omitted.

Subsequently, according to the third embodiment, after the image unfolding processing unit 13c has performed the unfolding process, the post-processing unit 33f applies a post-processing process to the unfolded image that has been obtained as a result of the unfolding process (step S305). Further, the post-processing unit 33f causes the display unit 15 to display the image obtained as a result of applying the post-processing process (step S306).

After that, the control unit 37 receives an instruction from the operator via the input unit 16, with regard to whether the abnormality judging process should be performed (step S307). In the case where the control unit 37 has received an instruction indicating that the abnormality judging process should not be performed (step S307: No), the post-processing unit 33f registers the image obtained as a result of applying the post-processing process, into the image data storage unit 14b (step S316).

On the contrary, in the case where the control unit 37 has received an instruction indicating that the abnormality judging process should be performed (step S307: Yes), the abnormal signal judging unit 13d generates a histogram of the pixel values included in the unfolded image that has been obtained as a result of the unfolding process performed by the image unfolding processing unit 13c (step S308). Further, the abnormal signal judging unit 13d calculates the median of the pixel values from the generated histogram (step S309). After that, based on the calculated median, the abnormal signal judging unit 13d judges whether the unfolded image includes one or more pixels of which the pixel values are abnormal (step S310).

In the case where the abnormal signal judging unit 13d has judged that the unfolded image includes no pixel of which the pixel value is abnormal (step S311: No), the post-processing unit 33f applies a post-processing process to the unfolded image that has been generated by the image unfolding processing unit 13c (step S315). After that, the post-processing unit 33f registers the image obtained as a result of applying the post-processing process, into the image data storage unit 14b (step S316).

On the contrary, in the case where the abnormal signal judging unit 13d has judged that the unfolded image includes one or more pixels of which the pixel values are abnormal (step S311: Yes), the control unit 37 causes the display unit 15 to display a message notifying that there are one or more abnormal pixels (step S312). After that, the control unit 37 receives an instruction from the operator via the input unit 16, with regard to whether the sensitivity distribution data should be corrected (step S313).

Further, in the case where the control unit 37 has received an instruction indicating that the sensitivity distribution data should not be corrected (step S313: No), the post-processing unit 33f applies a post-processing process to the unfolded image that has been generated by the image unfolding processing unit 13c (step S315). After that, the post-processing unit 33f registers the image obtained as a result of applying the post-processing process, into the image data storage unit 14b (step S316).

On the contrary, in the case where the control unit 37 has received an instruction indicating that the sensitivity distribution data should be corrected (step S313: Yes), the sensitivity distribution correcting unit 13e corrects the sensitivity distribution data stored in the sensitivity distribution data storage unit 14c in such a manner that the sensitivity difference between the channels in the position of each of the pixels of which the pixel values have been judged to be abnormal becomes larger (step S314).

After that, the process returns to step S304 so that the image unfolding processing unit 13c performs the unfolding process again by using the sensitivity distribution data that has been corrected. With this arrangement, until it is judged that the unfolded image includes no pixel of which the pixel value is abnormal, in accordance with the instructions from the operator, the sensitivity distribution data correcting process and the unfolding process are repeatedly performed. Subsequently, in the case where it has been judged that the unfolded image includes no pixel of which the pixel value is abnormal, or in the case where the operator has judged that it is not necessary to perform the abnormality judging process, the image obtained as a result of applying the post-processing process to the unfolded image is registered into the image data storage unit 14b.

As explained above, according to the third embodiment, the control unit 37 receives the instructions from the operator with regard to whether the abnormality judging process should be performed and whether the sensitivity distribution data should be corrected. Further, in the case where an instruction indicating that the abnormality judging process should be performed has been received, the abnormal signal judging unit 13d judges whether the unfolded image includes one or more pixels of which the pixel values are abnormal. Also, in the case where an instruction indicating that the sensitivity distribution data should be corrected has been received, the sensitivity distribution correcting unit 13e corrects the sensitivity distribution data. With these arrangements, according to the third embodiment, the operator is able to select, in accordance with the image taking site and the type of diagnosis to be made, whether it is necessary to perform the abnormality judging process on the unfolded image and whether it is necessary to re-create the unfolded image. As a result, the operator is able to control the MRI apparatus in such a manner that the abnormality judging process and the re-creating process of the unfolded image are performed only when those processes are required to make a diagnosis. Consequently, it is possible to shorten the time period required by examinations and to improve the throughput.

In the description of the third embodiment above, the example is explained in which the MRI apparatus performs the unfolded image abnormality judging process and the sensitivity distribution data correcting process that are described in the first embodiment, in accordance with the instructions from the operator. Similarly, another arrangement is acceptable in which the MRI apparatus performs the unfolded image abnormality judging process and the sensitivity distribution data re-creating process that are described in the second embodiment, in accordance with instructions from the operator.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
    an executing unit that executes an image taking sequence according to a parallel imaging method so as to collect magnetic resonance signals by using a plurality of radio frequency coils;
    a reconstructing unit that reconstructs a magnetic resonance image from the magnetic resonance signals;
    an unfolding processing unit that performs an unfolding process so as to unfold aliasing that has occurred in the magnetic resonance image, by using sensitivity distribution data indicating a spatial sensitivity distribution of the radio frequency coils;
    a judging unit that judges whether the unfolded image obtained as a result of the unfolding process includes one or more pixels of which pixel values are abnormal; and
    a correcting unit that, in a case where the judging unit has judged that the unfolded image includes one or more pixels of which the pixel values are abnormal, corrects the sensitivity distribution data in such a manner that the pixel values of the pixels become closer to a normal value, wherein
    after the sensitivity distribution data has been corrected, the unfolding processing unit performs the unfolding process again by using the sensitivity distribution data that has been corrected.

2. The magnetic resonance imaging apparatus according to claim 1, wherein the correcting unit corrects the sensitivity distribution data in such a manner that a sensitivity difference between channels in a position of each of the pixels of which the pixel values have been judged to be abnormal becomes larger.

3. The magnetic resonance imaging apparatus according to claim 2, wherein the judging unit calculates a representative value of pixel values, based on a distribution state of pixel values of pixels included in the unfolded image, and judges whether the unfolded image includes one or more pixels of which the pixel values are abnormal, based on the representative value that has been calculated.

4. The magnetic resonance imaging apparatus according to claim 3, wherein the judging unit calculates a median as the representative value.

5. The magnetic resonance imaging apparatus according to claim 1, wherein the judging unit calculates a representative value of pixel values, based on a distribution state of pixel values of pixels included in the unfolded image, and judges whether the unfolded image includes one or more pixels of which the pixel values are abnormal, based on the representative value that has been calculated.

6. The magnetic resonance imaging apparatus according to claim 5, wherein the judging unit calculates a median as the representative value.

7. A magnetic resonance imaging apparatus comprising:
an executing unit that executes an image taking sequence according to a parallel imaging method so as to collect magnetic resonance signals by using a plurality of radio frequency coils;
a reconstructing unit that reconstructs a magnetic resonance image from the magnetic resonance signals;
an unfolding processing unit that performs an unfolding process so as to unfold aliasing that has occurred in the magnetic resonance image, by using sensitivity distribution data indicating a spatial sensitivity distribution of the radio frequency coils;
a judging unit that judges whether the unfolded image obtained as a result of the unfolding process includes one or more pixels of which pixel values are abnormal; and
a re-creating unit that, in a case where the judging unit has judged that the unfolded image includes one or more pixels of which the pixel values are abnormal, re-creates the sensitivity distribution data by causing the executing unit to execute a sensitivity measuring sequence so as to measure a spatial sensitivity distribution of the radio frequency coils, wherein
after the sensitivity distribution data has been re-created, the unfolding processing unit performs the unfolding process again by using the sensitivity distribution data that has been re-created.

8. The magnetic resonance imaging apparatus according to claim 7, wherein the judging unit calculates a representative value of pixel values, based on a distribution state of pixel values of pixels included in the unfolded image, and judges whether the unfolded image includes one or more pixels of which the pixel values are abnormal, based on the representative value that has been calculated.

9. The magnetic resonance imaging apparatus according to claim 8, wherein the judging unit calculates a median as the representative value.

* * * * *